(12) United States Patent
Oyama et al.

(10) Patent No.: US 9,679,794 B2
(45) Date of Patent: Jun. 13, 2017

(54) SPACER, SPACER TRANSFERRING METHOD, PROCESSING METHOD AND PROCESSING APPARATUS

(71) Applicant: TOKYO ELECTRON LIMITED, Tokyo (JP)

(72) Inventors: Katsuhiko Oyama, Oshu (JP); Yasushi Takeuchi, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 288 days.

(21) Appl. No.: 14/025,899

(22) Filed: Sep. 13, 2013

(65) Prior Publication Data
US 2014/0079526 A1     Mar. 20, 2014

(30) Foreign Application Priority Data
Sep. 14, 2012 (JP) ................ 2012-202466

(51) Int. Cl.
*H01L 21/68* (2006.01)
*H01L 21/677* (2006.01)
*H01L 21/673* (2006.01)

(52) U.S. Cl.
CPC ...... *H01L 21/677* (2013.01); *H01L 21/67346* (2013.01); *H01L 21/68* (2013.01)

(58) Field of Classification Search
CPC . H01L 21/677; H01L 21/67346; H01L 21/68; H01L 21/67109; H01L 21/67309; H01L 21/67757; H01L 21/67781; H01L 21/68707

USPC .......... 414/802; 206/303, 454, 710
See application file for complete search history.

(56) References Cited

U.S. PATENT DOCUMENTS

| 5,169,453 | A  | * | 12/1992 | Takagi ................ 118/728 |
| 2005/0011808 | A1 | * | 1/2005 | Pylant et al. ........... 206/710 |
| 2005/0062465 | A1 | * | 3/2005 | De Ridder ............. 324/158.1 |
| 2006/0144752 | A1 | * | 7/2006 | Forsyth ................ 206/710 |
| 2007/0284282 | A1 | * | 12/2007 | Yajima et al. .......... 206/710 |
| 2012/0230805 | A1 | * | 9/2012 | Yamagishi et al. ....... 414/785 |

FOREIGN PATENT DOCUMENTS

| JP | 2009-81259 A | 4/2009 |
| JP | 2012-134387 A | 7/2012 |
| JP | 2012-134388 A | 7/2012 |
| JP | 2012-186368 A | 9/2012 |
| JP | 2012-190850 A | 10/2012 |

\* cited by examiner

*Primary Examiner* — Michael McCullough
*Assistant Examiner* — Lynn Schwenning
(74) *Attorney, Agent, or Firm* — Nath, Goldberg & Meyer; Jerald L. Meyer

(57) ABSTRACT

According to an embodiment of present disclosure, a spacer is provided. The spacer includes at least a protrusion formed to protrude from an outer periphery of the spacer. The protrusion serves to locate the spacer in place in a transfer mechanism configured to transfer the spacer when the spacer is fixed by the transfer mechanism in such a way that the protrusion comes in contact with the transfer mechanism, and configured to allow the spacer to rotate or move in case the spacer is deviated from a predetermined transfer position when the spacer is engaged with the transfer mechanism.

4 Claims, 7 Drawing Sheets

SPACER, SPACER TRANSFERRING METHOD, PROCESSING METHOD AND PROCESSING APPARATUS

CROSS-REFERENCE TO RELATED APPLICATION

This application claims the benefit of Japanese Patent Application No. 2012-202466, filed on Sep. 14, 2012, in the Japan Patent Office, the disclosure of which is incorporated herein in its entirety by reference.

TECHNICAL FIELD

The present disclosure relates to a spacer, a spacer transferring method, a processing method and a processing apparatus.

BACKGROUND

In the manufacture of semiconductor devices, various kinds of processing apparatuses are used to process oxidization, diffusion, chemical vapor deposition (CVD) and the like with respect to target objects to be processed such as semiconductor wafers. Among such apparatuses, a vertical processing apparatus, which can process a plurality of target objects at one time, has been known.

In the processing apparatus, it is necessary to increase the number of the semiconductor wafers loaded into the apparatus (boat). For example, there has been proposed a method for holding a plurality of stacks on the boat at predetermined intervals in a vertical direction, each of the stacks having two semiconductor wafers stacked in layers with a spacer provided between them. The two semiconductor wafers face each other at their untreated bottom surfaces.

It has been required that the spacer be automatically transferred into the boat in the maintenance and so on. However, when the spacer is transferred sequentially, the spacer rotates or deviates from a transfer position due to thermal expansion, shifts in the transfer and the like. Therefore, there is a possibility that the spacer cannot be transferred. In this case, it is necessary to perform a process for taking out the spacer to the outside of the apparatus and reset the rotation of the spacer once. In this regard, there is a problem that a stoppage of the apparatuses may be needed to take out the spacer. Thus, there is a need for a transferring apparatus, a transferring method and the like that can transfer the spacer sequentially.

SUMMARY

Some embodiments of the present disclosure are directed to a spacer, a spacer transferring method, a processing method and a processing apparatus capable of transferring the spacer sequentially.

According to a first aspect of the present disclosure, there is provided a spacer for use in a processing apparatus where a plurality of target objects to be processed are accommodated within a holder in such a manner that at least two target objects at a time are supported at their edges, where the bottom surfaces of the at least two target objects are facing each other, to form a stack and where the holder accommodating the plurality of target object is transferred into the apparatus to perform a process upon top surfaces of the target objects, the spacer comprising: at least a protrusion formed to protrude from an outer periphery of the spacer, wherein the protrusion serves to locate the spacer in place in a transfer mechanism configured to transfer the spacer when the spacer is fixed by the transfer mechanism in such a way that the protrusion comes in contact with the transfer mechanism, and configured to allow the spacer to rotate or move in case the spacer is deviated from a predetermined transfer position when the spacer is engaged with the transfer mechanism.

According to a second aspect of the present disclosure, there is provided a spacer transferring method for use in a processing apparatus where a plurality of target objects to be processed are accommodated within a holder in such a manner that at least two target objects at a time are supported at their edges, where the bottom surfaces of the at least two target objects are facing each other, to form a stack and wherein the holder accommodating the plurality of target object is transferred into the apparatus to perform a process upon top surfaces of the target objects, the method comprising: a spacer provided with at least a protrusion formed to protrude from an outer periphery of the spacer, wherein the protrusion locates the spacer in place in a transfer mechanism configured to transfer the spacer when the spacer is fixed by the transfer mechanism in such a way that the protrusion comes in contact with the transfer mechanism to allow the spacer to rotate or move in case the spacer is deviated from a predetermined transfer position when the spacer is engaged with the transfer mechanism.

According to a third aspect of the present disclosure, there is provided a processing method comprising: forming a stack by accommodating a spacer in a holder in such a manner that two target objects to be processed are supported at their edges, with bottom surfaces of the objects facing each other; and transferring the holder accommodating therein a plurality of stacks into a process apparatus to perform a process upon top surfaces of the target objects, wherein a spacer is provided with at least a protrusion formed to protrude from an outer periphery of the spacer, and herein the forming the stack comprises: disposing a first target object on a predetermined position of the holder with a bottom surface thereof facing upward; transferring the spacer to dispose the spacer on the first target object disposed with the bottom surface thereof facing upward; and disposing the second target object on the spacer with a bottom surface thereof facing downward, and wherein, in the disposing the first and second target objects, the protrusion locates the spacer in place in a transfer mechanism configured to transfer the spacer when the spacer is fixed by the transfer mechanism in such a way that the protrusion comes in contact with the transfer mechanism to allow the spacer to rotate or move in case the spacer is deviated from a predetermined transfer position when the spacer is engaged with the transfer mechanism.

According to a fourth aspect of the present disclosure, there is provided a processing apparatus where a plurality of target objects to be processed are accommodated within a holder in such a manner that at least two target objects at a time are supported at their edges, where the bottom surfaces of the at least two target objects are facing each other, to form a stack and where the holder accommodating the plurality of target object is transferred into the apparatus to perform a process upon top surfaces of the target objects, the processing apparatus comprising: a space provided with at least a protrusion formed to protrude from an outer periphery of the spacer, wherein the protrusion locates the spacer in place in a transfer mechanism configured to transfer the spacer when the spacer is fixed by the transfer mechanism in such a way that the protrusion comes in contact with the transfer mechanism to allow the spacer to rotate or move in case the spacer is deviated from a predetermined transfer position when the spacer is engaged with the transfer mechanism.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
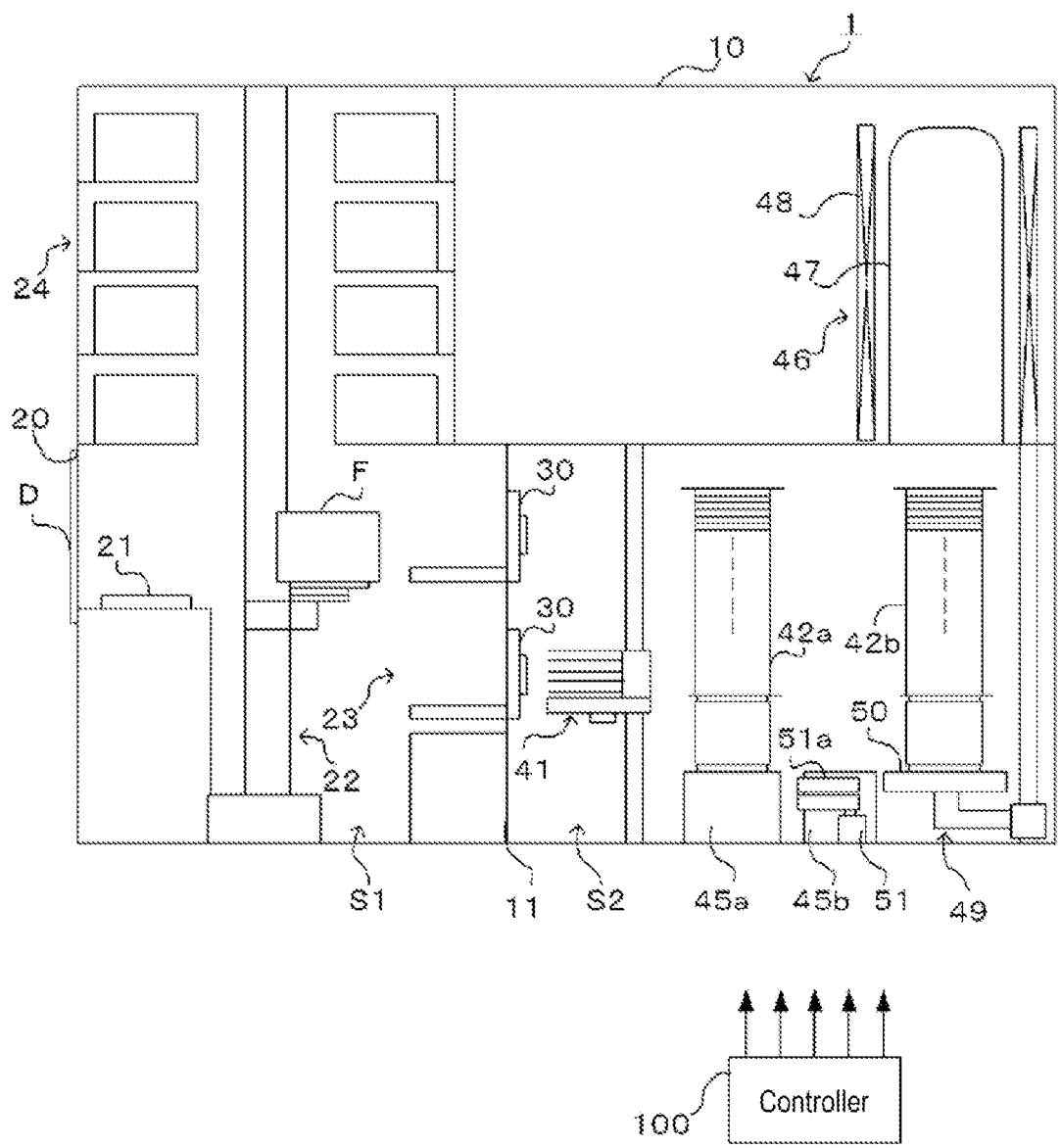
FIG. 1 is a front view illustrating a configuration of a processing apparatus according to some embodiments.

A spacer, a spacer transferring method, a processing method and a processing apparatus according to the present disclosure will be described. According to an embodiment, a case where a heat treatment processing apparatus 1 shown in FIG. 1 is used will be described. Further, in the embodiment, in order to increase the number of accommodated target objects to be processed, for example semiconductor wafers, the semiconductor wafers are kept in a state where their bottom surfaces face each other, and the semiconductor wafers are stacked with spacers therebetween, as described below. First, an outline of the heat treatment apparatus 1 of the present embodiment will be described.

As shown in FIG. 1, a processing chamber 10 of a heat treatment apparatus 1 according to the present embodiment is divided into a working area S1 and a loading area S2 by a partition wall 11. The working area S1 is used for transferring and storing a front opening unified pod (FOUP) F, which is a sealed transfer container for accommodating a plurality (e.g., 25 sheets) of semiconductor wafers or spacers. For example, the working area S1 is kept in an atmosphere. The loading area S2 is used for performing a heating process, such as a film forming process or an oxidizing process with respect to the semiconductor wafers W. The loading area S2 is kept in an inert gas, for example a nitrogen gas ($N_2$) atmosphere.

In the working area S1, there are provided a load port 21, a FOUP transfer mechanism 22, transfer stages 23 and storage units 24.

The FOUP F transferred by an external transfer mechanism (not shown) from a transfer port 20 formed in the side of the processing chamber 10 is loaded on the load port 21. A door D is provided in a position corresponding to the transfer port 20 on the outside of the processing chamber 10. The transfer port 20 is configured to be closed and opened by the door D.

The FOUP transfer mechanism 22 is provided between the load port 21 and the transfer stages 23. The FOUP transfer mechanism 22 transfers the FOUP F within the working area S1. The FOUP transfer mechanism 22 transfers the FOUP F on the load port 21 to the storage unit 24 provided in an upper side of the working area S1, and transfers the FOUP F stored in the storage unit 24 to the transfer stages 23.

The transfer stages 23 are provided on a working area S1 side of the partition wall 11. The transfer stages 23 loads the FOUP F transferred by the FOUP transfer mechanism 22. In the transfer stage 23, the semiconductor wafers W and the spacers S are taken out of the loaded FOUP F to be transferred to the loading area S2 by a transfer mechanism 41 to be described later. For example, the transfer stage 23 includes upper and lower transfer stages. Also, the partition wall 11 laterally positioned within the transfer stage 23 has an opening. A shutter 30 is provided on the side of the partition wall 11 facing the loading area S2 to close the opening.

Figure 2:
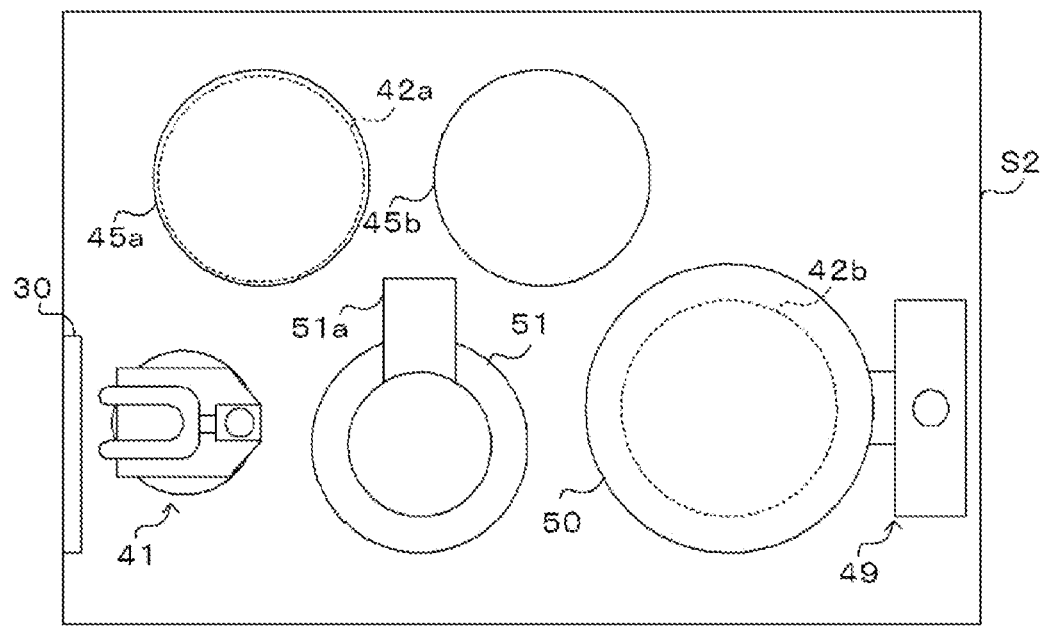
FIG. 2 is a plan view illustrating a configuration of a loading area of FIG. 1.

FIG. 2 is a plan view illustrating a configuration of the loading area S2. As shown in FIG. 2, the transfer mechanism 41, a boat loading table 45 (45a, 45b) and a boat transfer mechanism 51 are provided within the loading area S2.

The transfer mechanism 41 is provided between the shutter 30 and the boat loading table 45a. The transfer mechanism 41 performs the delivery of the semiconductor wafers W and the spacers S between the FOUP F placed on the transfer stage 23 and the wafer boat 42 placed on the boat loading table 45a.

Figure 3:
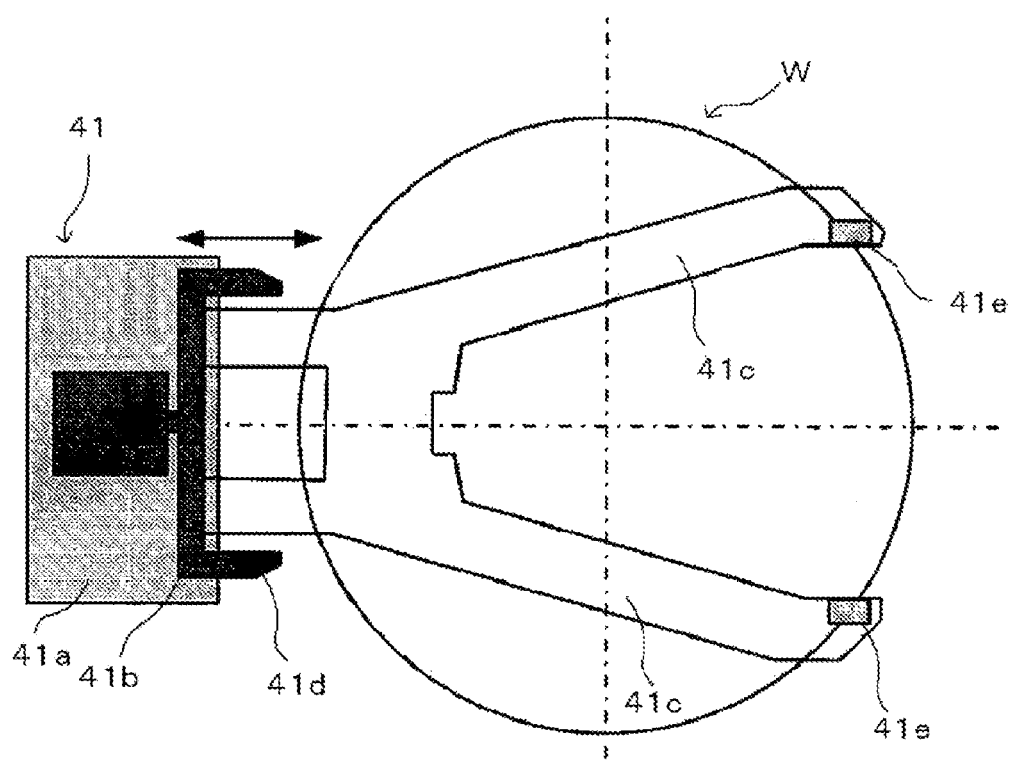
FIG. 3 is a diagram illustrating a configuration of a transfer mechanism.

FIG. 3 illustrates a configuration of the transfer mechanism 41. Further, FIG. 3 shows a state of placing the semiconductor wafers W on the transfer mechanism 41. As shown in FIG. 3, the transfer mechanism 41 includes an elevating part 41a, a fixing part 41b and a fork 41c.

The elevating part 41a includes an elevating mechanism capable of elevating the fixing part 41b and the fork 41c. The fixing part 41b has fixing pieces 41d configured to be movable as shown in an arrow of FIG. 3. The fork 41c engages one end of the semiconductor wafer W by end parts 41e thereof. The semiconductor wafer W is fixed (interposed) by the transfer mechanism 41 through movements of the fixing pieces 41d of the fixing part 41b to the other end of the semiconductor wafer W while one end of the semiconductor wafer W is engaged with the fixing pieces 41d of the fixing part 41b. Thus, the semiconductor wafer W is transferred by the movement of the fork 41c (transfer mechanism 41) while being fixed to the transfer mechanism 41.

The boat loading table 45 is a table for placing thereon the wafer boat 42. In the embodiment, two boat loading tables, i.e., the boat loading table 45a for placing the wafer boat 42 thereon, which is for the delivery of the semiconductor wafers W or the spacer S by the transfer mechanism, and the boat loading table 45b for placing thereon the wafer boat 42 in a standby state. Further, as for the wafer boat 42, a plurality of wafer boats, for example, two wafer boats 42a and 42b are used alternately.

The heat treatment furnace 46 includes a quartz-made cylindrical processing chamber 47 having a bottom opening and a roof. A cylindrical heater 48 is provided around the processing chamber 47 to heat the semiconductor wafers W within the processing chamber 47. A cap 50 capable of moving up and down by an elevating mechanism 49 is arranged below the processing chamber 47. The semiconductor wafers W are loaded into the processing chamber 47 by moving up the cap on which the wafer boat 42 accommodating the semiconductor wafers W is placed. Upon loading the semiconductor wafers W, the bottom opening of the processing chamber 47 is hermetically sealed by the cap 50.

The boat transfer mechanism 51 is provided near the boat loading table 45. The boat transfer mechanism 51 includes an extendible and retractable arm 51a to transfer the wafer boat 42 between the cap 50 and the boat loading tables 45a and 45b.

Figure 4:
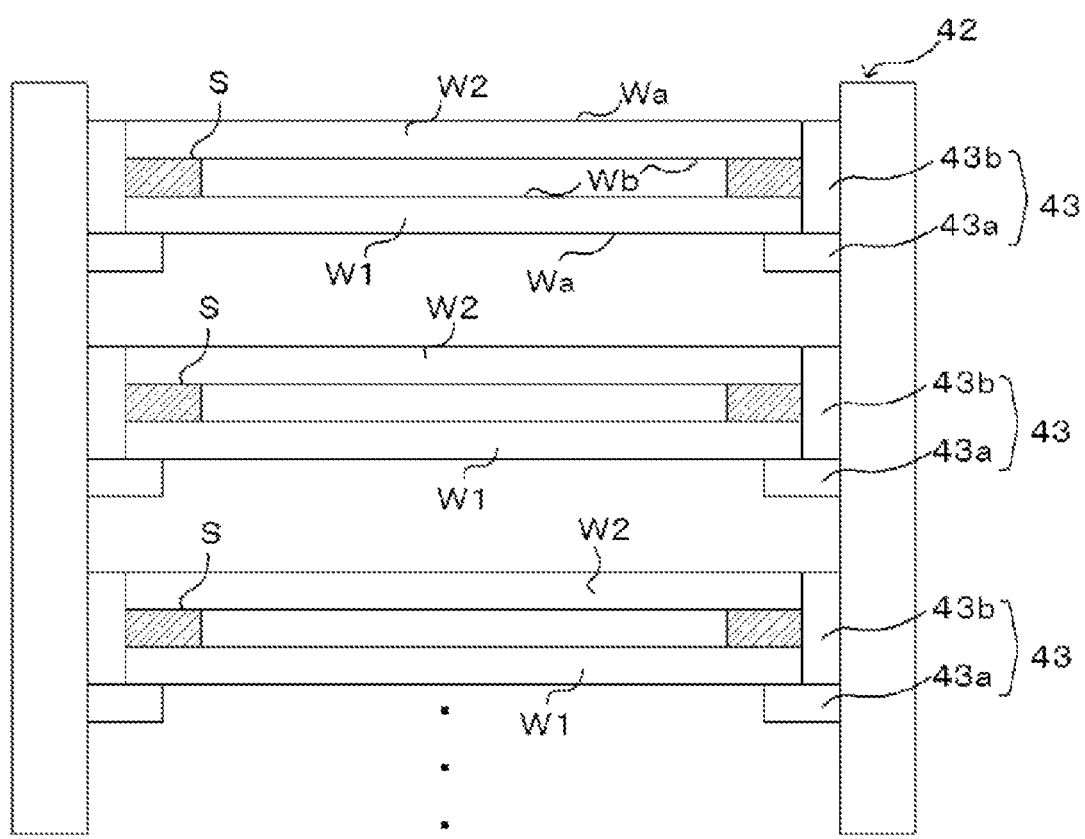
FIG. 4 is a diagram illustrating a state of accommodating semiconductor wafers and spacers in a wafer boat.

FIG. 4 shows a state of accommodating the semiconductor wafers W and the spacer S within the wafer boat 42. As shown in FIG. 4, an arm portion 43 of the wafer boat 42 includes a bottom portion 43a and a side wall portion 43b and, in the cross sectional plane, which is perpendicular to a circumferential direction of the wafer boat 42, has a shape of "L". An edge of a lower semiconductor wafer W1 whose bottom surface Wb facing upward (whose top surface Wa facing downward) is supported by the bottom portion 43a. The spacer S is stacked on the lower semiconductor wafer W1 whose edge of the bottom surface Wb is supported by the bottom portion 43a. In addition, an upper semiconductor wafer W2 whose bottom surface Wb facing downward (whose top surface Wa facing upward) is supported on the spacer S. The side wall portion 43b is provided adjacent to the side surfaces of the lower semiconductor wafer W1, the spacer S and the upper semiconductor wafer W2, thereby preventing a horizontal displacement of the lower semiconductor wafer W1, the spacer S and the upper semiconductor wafer W2.

Thus, the two semiconductor wafers W1 and W2, facing each other at their bottom surfaces, are stacked with the spacer S within the wafer boat 42. That is, a stack is formed in which the semiconductor wafers W1 and W2, whose bottom surfaces are facing each other, are supported at their edges by the spacer S. A predetermined process is performed upon the top surfaces Wa of the semiconductor wafers W by loading a holder into the heat treatment apparatus 1 in a state such that a plurality of stacks are accommodated in the wafer boat 42. By forming the stack in this manner, a gap between the bottom surface Wb of the lower semiconductor wafer W1 and the bottom surface Wb of the upper semiconductor wafer W2 can be narrowed. Thus, it is possible to increase the number of the semiconductor wafers W to be accommodated on the wafer boat 42.

Figure 5:
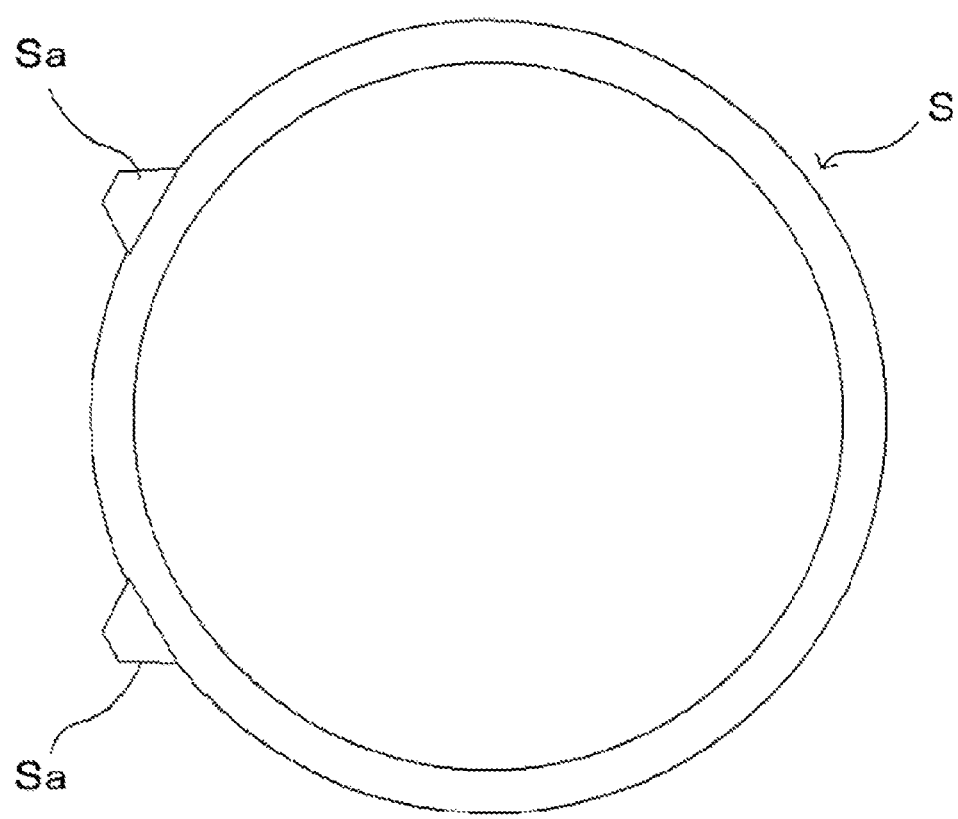
FIG. 5 is a schematic diagram showing one of the spacers of FIG. 4.

FIG. 5 is a schematic diagram showing a shape of a spacer S, according to some embodiments. As shown in FIG. 5, the spacer S has a ring shape. An outer diameter of the spacer S is formed to be substantially equal to the outer diameter of the semiconductor wafers W. The inner diameter of the spacer S is formed to be slightly smaller than the outer diameter of the semiconductor wafers W. As shown in FIG. 4, the ring shaped portion of the spacer S can be interposed between the edges of the two semiconductor wafers W1 and W2, whose bottom surfaces Wb that facing each other when various processes such as film forming process are performed within the wafer boat 42. Thus, a source gas does not enter the gap of the two semiconductor wafers W1 and W2 whose bottom surfaces Wb are facing each other when the film process is performed. Therefore, it is possible to suppress the formation of the film on the bottom surfaces Wb of the semiconductor wafers W1 and W2. For example, the spacer S may be made of quartz, silicon carbide (Sic), silicon and the like.

Also, a pair of protrusions Sa are formed to protrude from an outer periphery of the spacer S. The protrusions Sa may be of a tapered shape having a narrower width along a radially outward direction from an outer periphery of the spacer S. The protrusions Sa of the spacer S serve to locate the spacer S in place in the transfer mechanism 41 when the spacer S is fixed by the transfer mechanism 41 in such a way that the protrusions Sa come in contact with the transfer mechanism 41 (fixing pieces 41d). This allows the spacer S to rotate or move, in case the spacer S is not properly disposed on a predetermined transfer position when the spacer S is engaged with the transfer mechanism 41. For example, the protrusions Sa are formed at a position corresponding to the outside of the fixing pieces 41d of the fixing part 41b in a state that the spacer S is interposed in the transfer mechanism.

Figure 6:
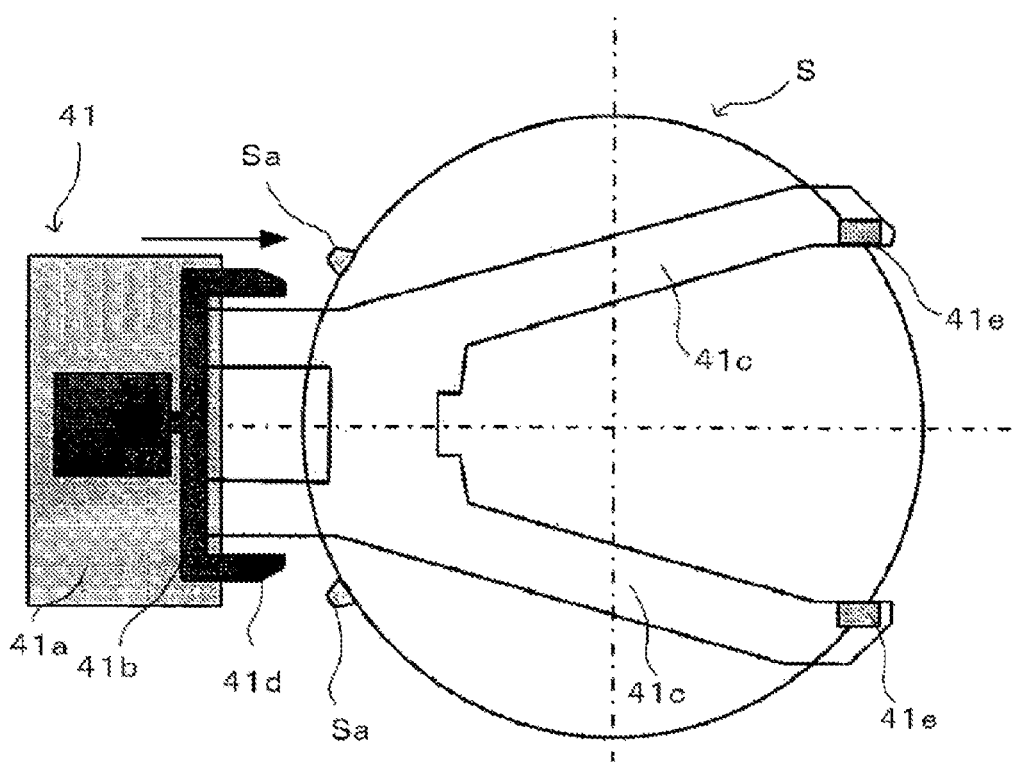
FIG. 6 is a diagram showing a state of engaging the spacer of FIG. 5 to the transfer mechanism.
Figure 7:
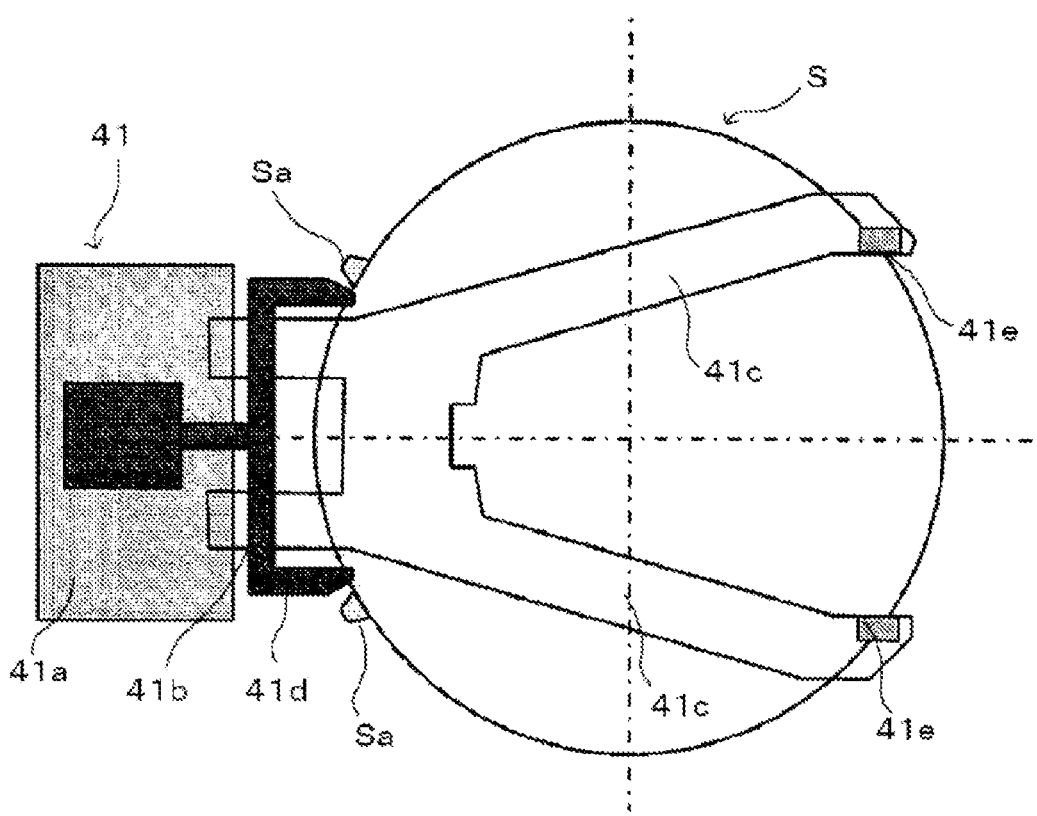
FIG. 7 is a diagram showing a state of interposing the spacer of FIG. 5 to the transfer mechanism.

FIG. 6 shows a state that the spacer S of FIG. 5 is engaged with the end parts 41e of the fork 41c of the transfer mechanism 41. FIG. 7 shows a state where the spacer S of FIG. 5 is interposed in the transfer mechanism 41. When the spacer S is disposed on the predetermined transfer position, the end parts 41e of the fork 41c engages one end of the spacer S as shown in FIG. 6, and the fixing pieces 41d come in contact with the other end of the spacer S to allow the spacer S to be interposed in the transfer mechanism 41 via movements of the fixing pieces 41d of the fixing part 41b to the side of the spacer S, as shown in FIG. 7. Thus, the spacer S is transferred by moving the fork 41c (transfer mechanism 41) in a state where the spacer S is fixed by the transfer mechanism 41.

When the spacer S is not properly disposed on the predetermined transfer position due to the rotation or the displacement from the transfer position of the spacer S, the fixing pieces 41d of the fixing part 41b come in contact with the protrusions Sa of the spacer S when, while the end parts 41e of the fork 41c engage one end of the spacer S, the fixing pieces 41d of the fixing part 41b of the transfer mechanism 41 move to the spacer S.

Since the protrusion Sa has a tapered shape, the spacer S moves and rotates so that the fixing pieces 41d of the fixing part 41b follow the tapered shape of the protrusions Sa when the fixing pieces 41d of the fixing part 41b further moves to the side of the spacer S from a state that the fixing pieces 41d of the fixing part 41b are contacted with the protrusions Sa. By the movement and rotation of the spacer S, the spacer S is fixed by the transfer mechanism 41 in a state that the spacer S is set on the predetermined transfer position. Thus, the protrusions Sa of the spacer S serve to reset the position of the spacer S along a back and forth direction, a right-left direction and/or a rotational direction to the predetermined transfer position. Therefore, it is possible to transfer the spacer S sequentially without having to move the spacer S to the outside of the heat treatment apparatus 1 and rotational reset any of the spacer S.

Various kinds of sensors may be arranged in the processing chamber 10 of the heat treatment apparatus 1. For example, position sensors such as end limit sensors and base position sensors for detecting the positions of the motors and cylinders may be provided in the processing chamber 10. In addition, a plurality of temperature sensors for measuring the internal temperature of the heat treatment furnace 46 and a plurality of pressure sensors for measuring the internal pressure of the heat treatment furnace 46 may be provided to the heat treatment furnace 46.

Figure 8:
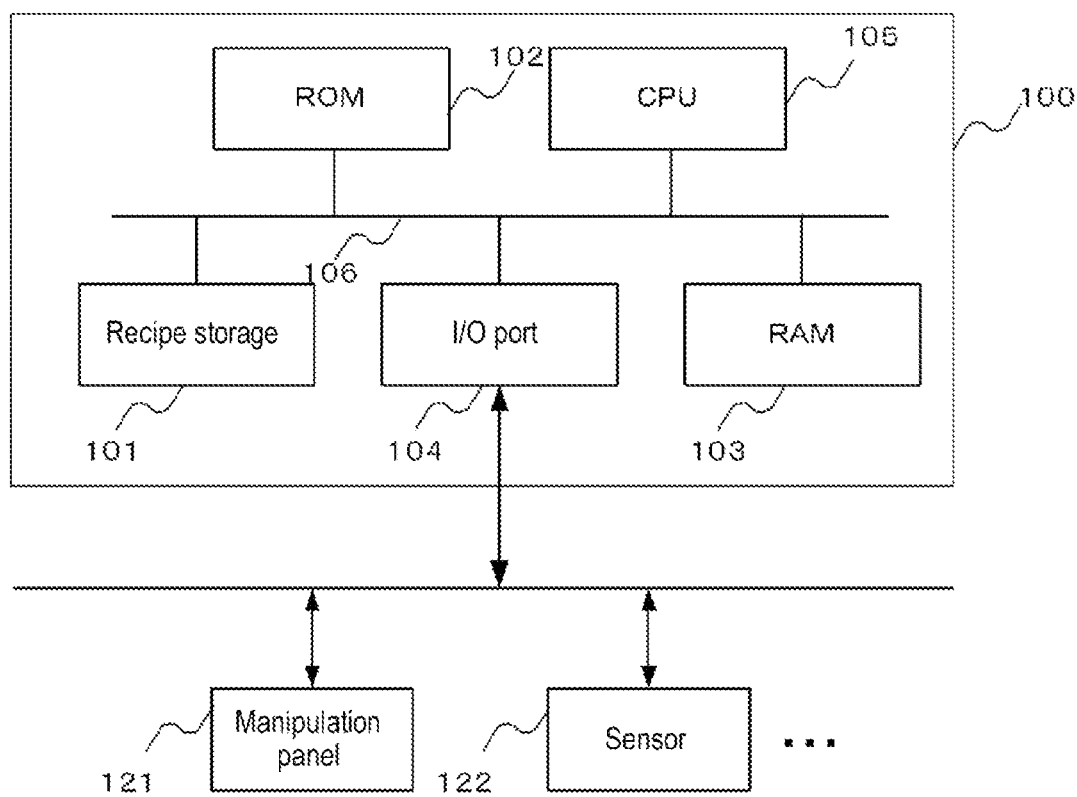
FIG. 8 is a diagram illustrating a configuration of a controller for controlling the processing apparatus of FIG. 1, according to some embodiments.

In addition, the heat treatment apparatus 1 may be connected to a controller 100 for controlling the respective components of the heat treatment apparatus 1. FIG. 8 illustrates a configuration of the controller 100. As shown in FIG. 8, the controller 100 is connected to a manipulation panel 121, sensors 122 and the like.

The manipulation panel 121 includes a display (display screen) and manipulation buttons. The manipulation panel 121 transmits the manipulation instruction of an operator to the controller 100, and displays information from the controller 100 on the display screen. The sensors 122 notify the controller 100 of the detected information.

As shown in FIG. 8, the controller 100 includes a recipe storage unit 101, a read only memory (ROM) 102, a random access memory (RAM) 103, an input/output (I/O) port 104, a central processing unit (CPU) 105, and a bus 106 for interconnecting the recipe storage unit 101, the ROM 102, the RAM 103, the I/O port 104 and the CPU 105.

The recipe storage unit 101 stores a process recipe for arranging control sequences according to types of processes being executed or to be executed in the heat treatment apparatus 1. The process recipe is a recipe being prepared for each of the treatments (processes) that are actually performed by the operator. The process recipe contains specific operation programs for the respective components of the heat treatment apparatus 1.

The ROM 102 includes an electrically erasable programmable read only memory (EEPROM), a flash memory, a hard disk and the like. The ROM 102 serves as a storage medium for storing an operation program and the like of the CPU 105. The RAM 103 serves as, for example, an operation area and the like of the CPU 105. The I/O port 104, for example, transmits the information from the sensors to the CPU 105 and transmits the control signals from the CPU 105 to the respective components of the heat treatment apparatus 1.

The CPU 105 is configured as the center of the controller 100 to execute the operation programs stored in the ROM 102. Also, in response to the commands inputted from the manipulation panel 121, the CPU 105 controls the operation of the heat treatment according to the process recipes stored in the recipe storage unit 101. The bus 106 transmits information among the respective components of the heat treatment apparatus 1.

Next, the processing method using the heat treatment apparatus 1 configured as mentioned above will be described. Further, in the present embodiment, the processing method will be described by exemplifying a case where the untreated semiconductor wafers W and spacers S within the FOUP F loaded on the load port 21 transferred from the outside of the working area S1 are accommodated in the heat treatment furnace 46, for performing the heat treatment upon the semiconductor wafers W, and the heat-treated semiconductor wafers W and spacers S are transferred to the load port 21 (or to outside of working area S1).

First, the controller 100 (CPU 105) drives the FOUP transfer mechanism 22 so that the FOUP transfer mechanism 22 transfers the FOUP F placed on the load port 21 to the transfer stage 23. For example, the CPU 105 transfers the FOUP F accommodating therein the untreated semiconductor wafers W, and the FOUP F accommodating therein the spacers S to the transfer stage 23.

Then, the CPU 105 opens the shutter 30. Also, the CPU 105 drives the transfer mechanism 41 to allow the semiconductor wafers W within the FOUP F placed on the transfer stage 23 to be disposed on a predetermined position within the wafer boat 42 placed on the boat loading table 45a with the bottom surface Wb of the semiconductor wafer W facing upward.

Subsequently, the CPU 105 drives the transfer mechanism 41 to allow the spacer S within the FOUP F placed on the transfer stage 23 to be dispensed on the semiconductor wafers W disposed on the predetermined position within the wafer boat 42.

During this process, since the protrusions Sa are formed in the spacer S, even though the spacer S is not properly disposed on the predetermined transfer position due to its rotation or displacement, the fixing pieces 41d of the fixing part 41b come in contact with the protrusions Sa of the spacer S by the movement of the fixing pieces 41d of the fixing part 41b of the transfer mechanism 41 to the side of the spacer S while the end parts 41e of the fork 41c engage one end of the spacer S. When the fixing pieces 41d of the fixing part 41b further move to the side of the spacer S in a state that the fixing pieces 41d of the fixing part 41b makes contact with the protrusions Sa, the spacer S moves and rotates in conformity with the tapered shape of the protrusions Sa in contact with the fixing pieces 41d of the fixing part 41b. The spacer S is fixed by the transfer mechanism 41 after the spacer S is set on the predetermined transfer position via its movement and rotation. Thus, the protrusions Sa of the spacer S serve for resetting a position of the spacer S along a back and forth direction, right-left direction and/or rotational direction to the predetermined transfer position. Therefore, it is possible to transfer the spacer S sequentially without moving the spacer S to the outside of the heat treatment apparatus 1 and without resetting the spacer S by rotation.

Next, the CPU 105 drives the transfer mechanism 41 to allow the semiconductor wafer W within the FOUP F placed on the transfer stage 23 to be disposed on the space S arranged at the predetermined position within the wafer boat 42 with its bottom surface up. In this manner, the semiconductor wafers W, with its bottom surfaces facing each other and spacer S, are accommodated in the wafer boat 42 in a form of stack.

After all the semiconductor wafers W and the spacers S within the FOUP F are accommodated in the wafer boat 42, The CPU 105 drives the FOUP transfer mechanism 22 to transfer the FOUP F placed on the transfer stage 23 to the load port 21. Then, the CPU 105 drives the FOUP transfer mechanism 22 to transfer the FOUP F to the outside of the working area S1. Also, the CPU 105 may store the FOUP F, which does not accommodate the semiconductor wafers W and the spacers S, in the storage unit 24.

When the predetermined number of the semiconductor wafers W is accommodated in the wafer boat 42, the CPU 105 closes the shutter 30. Subsequently, the CPU 105 drives the boat transfer mechanism 51 to transfer the wafer boat 42 placed on the boat loading table 45a onto the cap 50. When the wafer boat 42 accommodating the heat-treated semiconductor wafers W is placed on the cap 50 in an unloaded state after the heat treatment is completed in the heat treatment furnace 46, the CPU drives the elevating mechanism 49 to transfer the wafer boat 42 on the boat loading table 45b. In addition, upon finishing the transfer of the wafer boat 42 accommodating the untreated semiconductor wafers W onto the cap 50, the CPU 105 drives the elevating mechanism 49 to move the cap 50 upwards to load the wafer boat 42 into the processing chamber 47 of the heat treatment furnace 46.

After the untreated semiconductor wafers W are loaded into the processing chamber 47, the CPU 105 controls the heat treatment furnace 46 to perform a predetermined heat treatment such as the film forming process, the oxidizing and diffusing process and the like. Upon finishing the heat treatment, the CPU 105 drives the elevating mechanism 49 to move the cap 50 downward. Consequently, the wafer boat 42 accommodating the heat-treated semiconductor wafers W is moved downward and unloaded from the processing chamber 47.

After the wafer boat 42 (heat-treated semiconductor wafers W) is unloaded, the CPU 105 drives the boat transfer mechanism 51 to transfer the wafer boat 42 placed on the cap 50 to the boat loading table 45a. In addition, the CPU 105 drives the FOUP transfer mechanism 22 to transfer the FOUP F, which does not accommodate the semiconductor wafers W and the spacers S, placed on the load port 21 to the transfer stage 23. The FOUP F, which does not accommodate the semiconductor wafers W and the spacers S, is transferred to the load port 21 by a transfer mechanism (not shown). Then, the CPU 105 opens the shutter 30 and drives the transfer mechanism 41 to allow the heat-treated semiconductor wafers W within the wafer boat 42 placed on the boat loading table 45a to be accommodated into the FOUP F placed on the transfer stage 23. In addition, the CPU 105 drives the transfer mechanism 41 to allow the spacers S within the wafer boat 42 placed on the boat loading table 45a to be accommodated into the FOUP F placed on the transfer stage 23.

After a predetermined number of the heat-treated semiconductor wafers W is accommodated in the FOUP F, the CPU 105 drives the FOUP transfer mechanism 22 to transfer the FOUP F placed on the transfer stage 23 to the load port 21. After a predetermined number of the spacers S is accommodated in the FOUP F, the CPU 105 drives the FOUP transfer mechanism 22 to transfer the FOUP F placed on the transfer stage 23 to the load port 21. The CPU 105 transfers the FOUFs F to the outside of the working area S1. After all the semiconductor wafers W and the spacers S accommodated in the wafer boat 42 are transferred to the outside of the working area S1, the CPU 105 closes the shutter 30 and finishes the process.

As described above, according to the present embodiment, since the protrusions Sa are formed in the spacer S, even though the spacer S is not properly disposed on the predetermined transfer position due to its rotation or displacement from the transfer position, the spacer S is fixed by the transfer mechanism 41 after being set to be in place on the predetermined transfer position. Therefore, it is possible to transfer the spacer S sequentially without moving the spacer S to the outside of the heat treatment apparatus 1 and rotationally resetting the spacer S.

The present disclosure is not limited to the embodiment described above but may be modified or applied in many different forms. Other embodiments applicable to the present disclosure will be described below.

Although the two protrusions Sa are formed in the spacer S in the embodiment, the number of the protrusions S is not limited to two, but may be three or more. It is desirable that the position at which the plurality of protrusions Sa is provided be positions symmetrical with the respect to a central axis of the spacer S in parallel with the movement direction of the fixing part 41b (fixing pieces 41d).

In addition, the protrusion Sa and the fixing pieces 41d may have any shape, as long as they are capable of locating the spacer S in place in the transfer mechanism 41 when the spacer S is fixed by the transfer mechanism 41 in such a way that the protrusions Sa come in contact with the transfer mechanism 41 (fixing pieces 41d) to allow the spacer S to rotate or move, in case the spacer S is not properly disposed on a predetermined transfer position when the spacer S is engaged with the transfer mechanism 41. That is, any shape is possible if the protrusions Sa and the fixing pieces 41d are capable of resetting the position of the spacer S along the back and forth, right-left, and/or rotational directions to the predetermined transfer position. The shape of the protrusions Sa and the fixing pieces 41d may not be the tapered shape. For example, the shape of the protrusions Sa may be a triangle shape or an arc shape.

Although the FOUP F is used as a receiving vessel for the spacer S and the semiconductor wafers W in the embodiment, for example, it is possible to use receiving vessels having different shapes for both of the spacers S and the semiconductor wafers W, respectively. In this case, the shape and the number of the protrusions provided in the spacer S may be varied so that the spacer S can be received even by a common commercial container.

Although the heat treatment apparatus 1 is used as the processing apparatus in the embodiment, the present disclosure may be applied to various processing apparatus such as apparatuses performing the oxidizing process, the diffusion process or the like. Also, although the target object to be processed is the semiconductor wafers W in the embodiment, the present disclosure may be applied to the process of, for example, a flat panel display (FPD) substrate, a glass substrate, a plasma display panel (PDP) substrate and the like.

The controller 100 according to the embodiment of the present disclosure can be implemented by using a normal computer system instead of a dedicated controller. For example, the controller 100 for performing the aforementioned processes can be configured by installing programs for execution of the processes into a general-purpose computer through the use of a recording medium (e.g., flexible disk or compact disc read only memory (CD-ROM)) storing the programs.

Also, the programs can be provided by any kinds of means. The programs may be provided not only by the storage medium mentioned above but also through a communication line, a communication network or a communication system. In this case, the programs may be posted on a bulletin board system (BBS) and provided through a network by imposing it on carrier waves. Thus, the programs provided as mentioned above are started up and executed in the same manner as other application programs under the control of an operating system (OS), thereby performing the processes described above.

The present disclosure is useful for the spacer, the spacer transferring method, the processing method and the heat treatment apparatus.

The present disclosure can transfer the spacers sequentially.

While certain embodiments have been described, these embodiments have been presented by way of example only, and are not intended to limit the scope of the disclosures. Indeed, the novel method, apparatus and storage medium described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A processing apparatus where a plurality of target objects to be processed are accommodated within a holder in such a manner that at least two target objects at a time are supported at their edges, where bottom surfaces of the at least two target objects are facing each other, to form a stack and where the holder accommodating the plurality of target objects are transferred into the apparatus to perform a process upon top surfaces of the plurality of target objects, the processing apparatus comprising:

a transfer mechanism including two fixing pieces; and a spacer including two protrusions that protrude from an outer periphery of the spacer at a distance from each other and are located outside of outer portions of the two fixing pieces of the transfer mechanism, which is configured to transfer the spacer such that the outer portions of the two fixing pieces are engaged with the two protrusions when the two fixing pieces contact the outer periphery of the spacer, wherein the spacer is removably disposed in the holder, and wherein the two protrusions serve to locate the spacer in place when the spacer is fixed by the transfer mechanism in such a way that the two protrusions rotate or move the spacer in case the spacer is deviated from a predetermined transfer position when the spacer is engaged with the transfer mechanism.

2. The processing apparatus of claim 1, wherein each of the two protrusions has a tapered shape having a narrower width along a radially outward direction from the outer periphery the spacer, and wherein the transfer mechanism includes the two fixing pieces configured to move toward the spacer while the transfer mechanism is changed from a state where the spacer is engaged with the transfer mechanism to a state where the spacer is fixed by the transfer mechanism, and wherein, during the transfer mechanism being changed to the state where the spacer is fixed by the transfer mechanism, one of the two fixing pieces contacts with one of the two protrusions and further movement of the two fixing pieces toward the spacer allows the spacer to rotate or move by movement of one of the two protrusions caused by a contact with one of the two fixing pieces in conformity with the tapered shape of the two protrusions in case the spacer is deviated from the predetermined transfer position when the spacer is engaged with the transfer mechanism.

3. A spacer transferring method for use in a processing apparatus where a plurality of target objects to be processed are accommodated within a holder in such a manner that at least two target objects at a time are supported at their edges, where bottom surfaces of the at least two target objects are facing each other, to form a stack and wherein the holder accommodating the plurality of target objects are transferred into the apparatus to perform a process upon top surfaces of the plurality of target objects, the method comprising:

engaging a spacer with a transfer mechanism, the spacer being provided with two protrusions formed to protrude from an outer periphery of the spacer at a distance from each other and located outside of outer portions of two fixing pieces of the transfer mechanism, which is configured to transfer the spacer such that the outer portions of the two fixing pieces are engaged with the two protrusions when the two fixing pieces contact the outer periphery of the spacer, moving the two fixing pieces of the transfer mechanism toward the spacer to fix the spacer in such a way that the spacer rotates or moves to be located in place by a contact between the two fixing pieces and the two protrusions, when the spacer is deviated from a predetermined transfer position, and transferring the spacer to removably dispose the spacer in the holder.

4. A processing method comprising:

forming a stack by accommodating a spacer in a holder in such a manner that two target objects to be processed are supported at their edges, with bottom surfaces of the objects facing each other; and transferring the holder accommodating therein a plurality of stacks into a process apparatus to perform a process upon top surfaces of the target objects, wherein the forming the stack comprises:

disposing a first target object on a predetermined position of the holder with a bottom surface thereof facing upward;

engaging a spacer with a transfer mechanism configured to transfer the spacer, the spacer being provided with at least two protrusions formed to protrude from an outer periphery of the spacer at a distance from each other and located outside of outer portions of two fixing pieces of the transfer mechanism, which is configured to transfer the spacer such that the outer portions of the two fixing pieces are engaged with the two protrusions when the two fixing pieces contact the outer periphery of the spacer;

moving the two fixing pieces of the transfer mechanism toward the spacer to fix the spacer in such a way that the spacer rotates or moves to be located in place by a contact between the two fixing pieces and the two protrusions, when the spacer is deviated from a predetermined transfer position;

transferring the spacer to dispose the spacer on the first target object disposed with the bottom surface thereof facing upward; and disposing a second target object on the spacer with a bottom surface thereof facing downward, and wherein the spacer is removable from the holder.

* * * * *